United States Patent
Ferrell

[19]

[11] Patent Number: 6,036,785
[45] Date of Patent: Mar. 14, 2000

[54] METHOD FOR REMOVING CHEMICAL RESIDUES FROM A SURFACE

[76] Inventor: Gary W. Ferrell, 608 Terrace Ave., Half Moon Bay, Calif. 94019

[21] Appl. No.: 08/850,272

[22] Filed: May 2, 1997

[51] Int. Cl.[7] .............................. B08B 3/08; B08B 3/12; B08B 7/02

[52] U.S. Cl. .................... 134/1; 134/1.3; 134/2; 134/3; 134/7; 134/25.4; 134/26; 134/28; 134/29

[58] Field of Search ................ 134/1.3, 1, 7, 2, 134/3, 25.4, 26, 28, 29

[56] References Cited

U.S. PATENT DOCUMENTS

| | | | |
|---|---|---|---|
| 4,203,257 | 5/1980 | Jamison et al. | 51/2 R |
| 4,889,585 | 12/1989 | Leyden et al. | 156/630 |
| 5,078,801 | 1/1992 | Malik | 134/29 |
| 5,230,182 | 7/1993 | Daniell et al. | 51/59 SS |
| 5,276,998 | 1/1994 | Joen et al. | 51/7 |
| 5,362,978 | 11/1994 | America | 257/228 |
| 5,478,270 | 12/1995 | Cuomo et al. | 451/5 |
| 5,551,907 | 9/1996 | Davé | 451/41 |
| 5,562,530 | 10/1996 | Runnels et al. | 451/36 |
| 5,679,169 | 10/1997 | Gonzales et al. | 134/1.3 |
| 5,735,963 | 4/1998 | Obeng | 134/3 |

*Primary Examiner*—Zeinab El-Arini
*Attorney, Agent, or Firm*—John Schipper

[57] ABSTRACT

Method [and apparatus] for quickly and controllably removing chemical residues and particle accumulations from an exposed surface of an object. A slurry, containing a slurry liquid and containing small scrubber particles that optionally have a range of at least two distinct particle sizes, is directed at the exposed surface to remove most or all of the residues and accumulations from the exposed surface. The slurry flow may be pulsed or be relatively constant. The exposed surface of the object is then partly or fully submerged in a rinse liquid that includes a strong base and/or a strong oxidizing agent. The rinse liquid is subjected to ultrasonic wave motion with a chosen wave displacement direction, and the ultrasonic waves have one or more distinct wavelengths, chosen to cover a range of expected sizes of chemical residues, particle accumulations and/or scrubber particles to be removed. Optionally, the ultrasonic wave displacement direction is chosen approximately parallel to an exposed surface from which residues, accumulations and/or scrubber particles are to be removed. Optionally, the ultrasonic wavelength(s) may be varied with time over a selected range of wavelengths that cover the range of sizes of particles to be removed.

27 Claims, 4 Drawing Sheets

METHOD FOR REMOVING CHEMICAL RESIDUES FROM A SURFACE

FIELD OF THE INVENTION

This invention relates to use of a slurry of particles to quickly and controllably clean material surfaces.

BACKGROUND OF THE INVENTION

Fabrication of semiconductors, of optical components and of other similar devices often requires many steps, some of which require cleaning of a device surface before the next step can be initiated. If a preceding step used a chemical reaction to alter or modify an exposed surface, a subsequent surface cleaning step is usually required in which chemical residues are removed before the next chemical can be applied. If hundreds of thousands or millions of these devices are being produced each day, each surface cleaning step must be carried out quickly and, preferably, automatically.

Use of a slurry of abrasive grit to enlarge apertures in a plate, to remove a portion of the plate material, for chemical-mechanical polishing (CMP) and for related functions has been disclosed by several workers, including Jamison et al in U.S. Pat. No. 4,203,257, Daniell et al in U.S. Pat. No. 5,230,182, Joen et al in U.S. Pat. No. 5,276,998, America in U.S. Pat. No. 5,362,978, Cuomo et al in U.S. Pat. No. 5,478,270, Dave in U.S. Pat. No. 5,551,907, and Runnels et al in U.S. Pat. No. 5,562,530. However, the previous workers appear to assume that the grit does not remain on the workpiece after application of the grit.

What is needed is a technique for quickly and controllably cleaning chemical residues and macroscopic accumulations of particles from an exposed surface of a material, where the exposed surface is not abraded or otherwise altered. Preferably, the surface should be cleaned roughly uniformly and should not have to be turned or otherwise moved until the cleaning process is completed. Preferably, the procedure should be carried out in a single chamber or container.

SUMMARY OF THE INVENTION

These needs are met by the invention, which directs a slurry of water or other suitable liquid and relatively "soft" microscopic scrubber particles, as a jet or stream against an exposed surface of a solid object to be cleaned, to remove most or all of the chemical residues and microscopic accumulations from the surface in a container. The slurry of liquid and microscopic scrubber particles is drained from the container, and the container (or another container containing the object) is refilled with a rinse liquid to partly or fully submerge the object. The rinse liquid is then subjected to ultrasonic wave action, to quickly and efficiently remove any remaining chemical residues, microscopic accumulations and scrubber particles from the exposed surface(s). The object may be a semiconductor wafer or an optical component in process. The scrubber particles preferably include silicon-based and/or carbon-based components, preferably have diameters between 0.3 $\mu$m and 100 $\mu$m, and need not be uniform in size or shape. The rinse liquid preferably includes a strong base or a strong oxidizing chemical, such as NaOH, KOH, $C_nH_{2n+1}OH(n=1, 2, \ldots)$, $H_2O_2$, $SOCl_2$, $NH_4OH$, $O_3 \cdot mH_2O$ (m=0, 1, 2, $\ldots$), $H_2SO_4$ or $HNO_2$.

DESCRIPTION OF BEST MODES OF THE INVENTION

Figure 1:
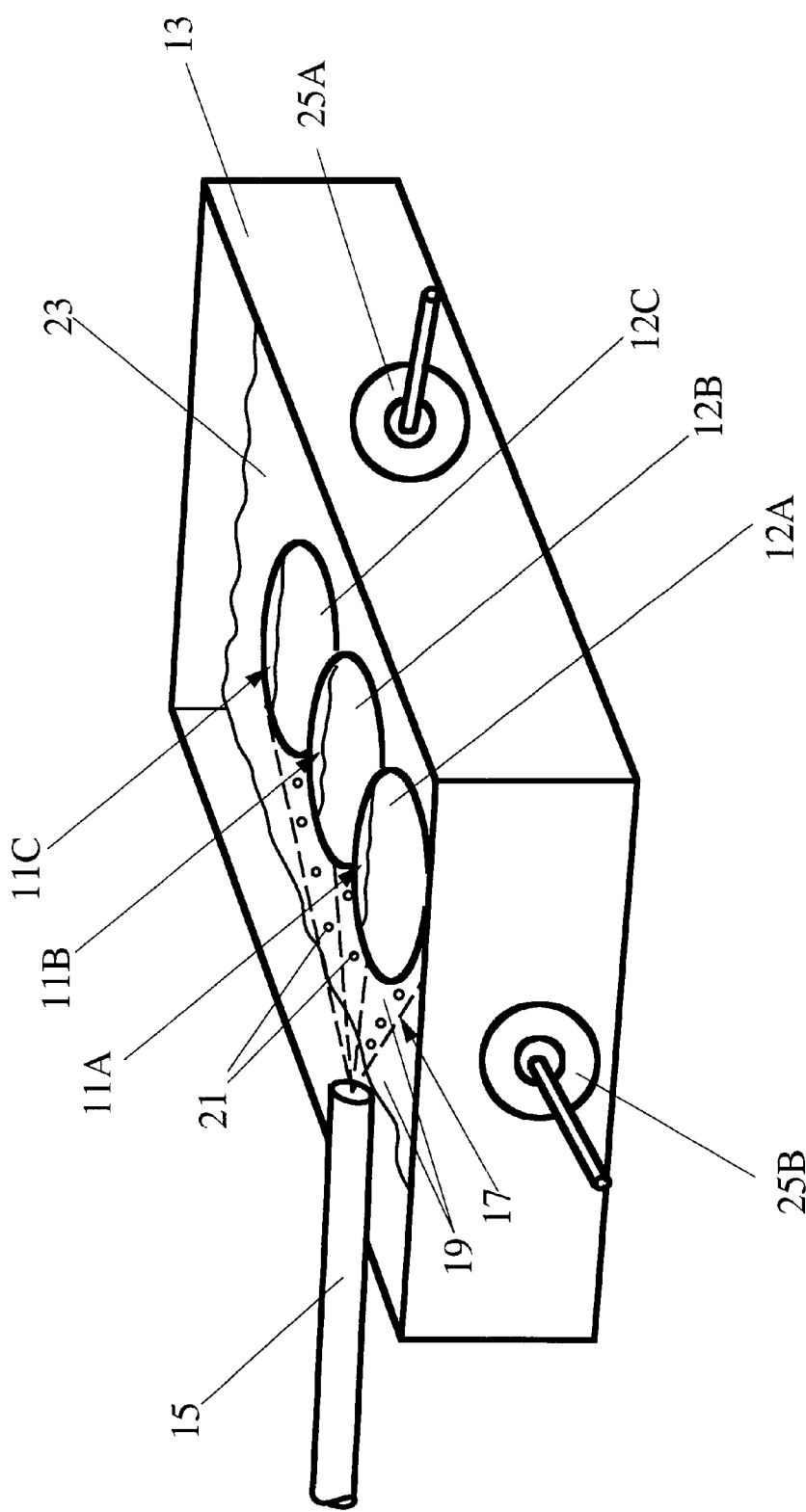
FIG. 1 illustrates use of the invention in one embodiment.

In FIG. 1, one or more disks, plates or other solid objects 11A, 11B, 11C of material, presented in a container 13, have chemical residues and macroscopic accumulations (referred to collectively as "residues") of particles thereon that are to be removed from one or more exposed surfaces of the objects. A streaming tube 15 directs a jet or stream of slurry 17, including a liquid 19 and a plurality of relatively soft microscopic scrubber particles 21, against one or more exposed surfaces 12A, 12B, 12C of the objects 11A, 11B, 11C to remove most or all of the residues. The slurry 17 and removed residues are drained from the container 13, and the container is then filled with a rinse liquid 23 to partly or fully immerse the objects 11A, 11B, 11C in the rinse liquid. The rinse liquid preferably includes a strong base or a strong oxidizing chemical, such as NaOH, KOH, $C_nH_{2n+1}OH(n=1, 2, \ldots)$, $H_2O_2$, $SOCl_2$, $NH_4OH$, $O_3 \cdot mH_2O$ (m=0, 1, 2, $\ldots$), $H_2SO_4$ or $HNO_2$.

Figure 2:
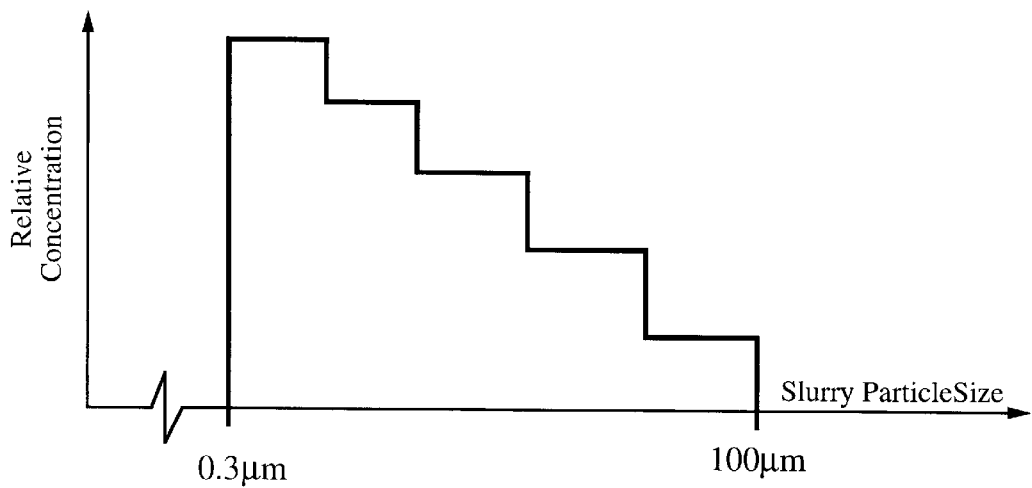
FIG. 2 graphically illustrates a range of liquid slurry particle mixes that may be used in practicing the invention.

The scrubber particles may be silicon-based or carbon-based or contain some other suitable material that will not cause abrasion or ablation of the exposed surfaces 12A, 12B, 12C of the objects 11A, 11B, 11C. The scrubber particles in the slurry may be soft grit particles of substantially pure silicon or carbon or may be polypropylene, PVDF, Teflon or some other chemical that is not substantially abrasive as long as the particles are not mechanically pressed with great force against the exposed surfaces 12A, 12B, 12C of the objects 11A, 11B, 11C. Scrubber particle sizes are preferably in the range 0.3 $\mu$m–100 $\mu$m and need not be substantially uniform. Optionally, the scrubber particle sizes in the slurry 17 may be "graded," as illustrated in FIG. 2, and may include two or more selected sizes in a graded mixture that is approximately optimal for the disk material and the characteristics of the residues to be removed from the exposed surfaces 12A, 12B, 12C. The volume fraction $\eta_p$ of the scrubber particles in the slurry preferably lies in the range $0.01 \leq \eta_p \leq 0.5$ but may be smaller than 0.01 and may be as large as about 0.75.

The temperature of the slurry 17 is selected in a range from T=T1=10° C. to about T=200° C., depending upon the disk material and the characteristics of the residues to be removed from the exposed surfaces 12A, 12B, 12C. The temperature of the rinse liquid 23 is also selected in a range from T=T2=10° C. to about T=200° C. The rinse liquid 23 is then subjected to ultrasonic wave motion, produced by one or more ultrasonic frequency generators 25A and 25B positioned contiguous to the container 13 or within the rinse liquid. The ultrasonic wave motion may produce cavitation within or adjacent to a boundary layer formed at the exposed surfaces 12A, 12B, 12C, which may help loosen the remaining chemical residues and accumulations of scrubber particles and other particles. However, the invention does not depend upon whether this or any other explanation is correct.

The ultrasonic wave motion produces a "scrubbing" action at the exposed surfaces 12A, 12B, 12C, often in the direction(s) of ultrasonic wave displacement, which is continued for a selected time interval having a length in the range 10 sec to 600 sec, or longer if desired. One, two or more ultrasonic frequency generators 25A or 25B are preferably, but not necessarily, positioned so that the ultrasonic waves produced have wave displacements that are approximately parallel to an exposed surface 12A of an object 11A from which residues, accumulations and scrubber particles are to be removed. In practice, if the exposed surfaces 12A, 12B, 12C approximately define two or more substantially non-parallel planes, this may require positioning of two or more ultrasonic frequency generators 25A and 25B as shown. Otherwise, use of a single ultrasonic frequency generator, 25A or 25B, may suffice here.

Figure 3:
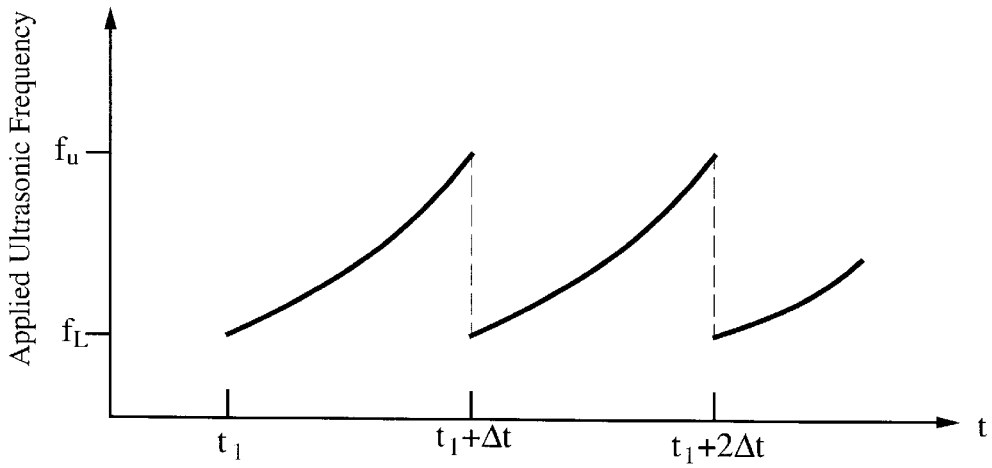
FIGS. 3 and 4 are graphical views of ultrasonic frequency as a function of time that may be used in practicing the invention.
Figure 4:
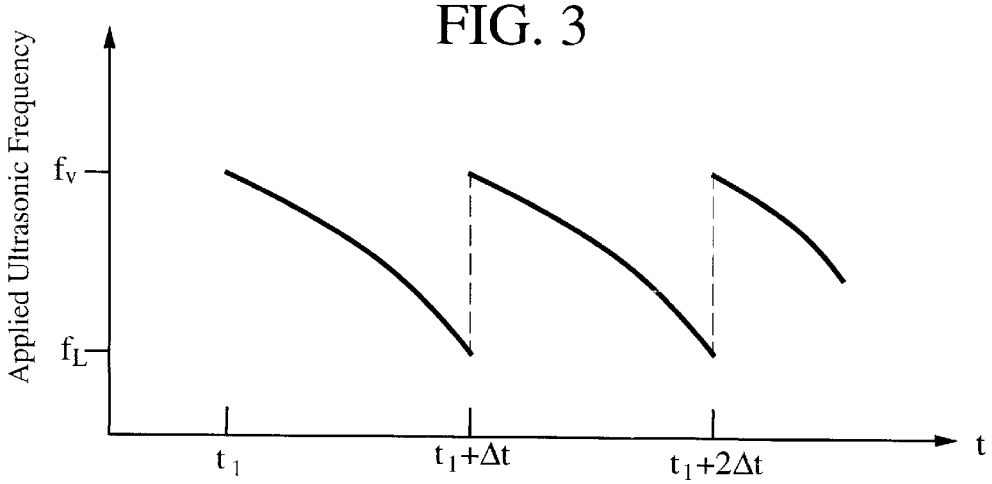

The ultrasonic frequencies used here lie in a range between 20 kHz and 1 MHz and are preferably chosen to produce wavelengths in the rinse liquid 23 that are substantially the same as, or somewhat smaller than, the expected range of residues to be removed. In one embodiment of te invention, the ultrasonic frequencies may be "chirped" or varied in a systematic manner as a function of time through a range of such frequencies, with corresponding ultrasonic wavelengths that cover a range of sizes of residues to be removed. FIGS. 3 and 4 illustrate two suitable choices of time-dependent variation of ultrasonic frequencies (chirping) produced by an ultrasonic frequency generator. The lower frequency bound $f_L$ and upper bound $f_U$ may be chosen to include between these two bounds a full range of sizes of residues that are expected to be encountered on the exposed surfaces 12A, 12B, 12C. In water, a range of particle sizes 0.3 $\mu$m–100 $\mu$m corresponds to a range of frequencies between 15 MHz and 51 GHz.

Figure 5:
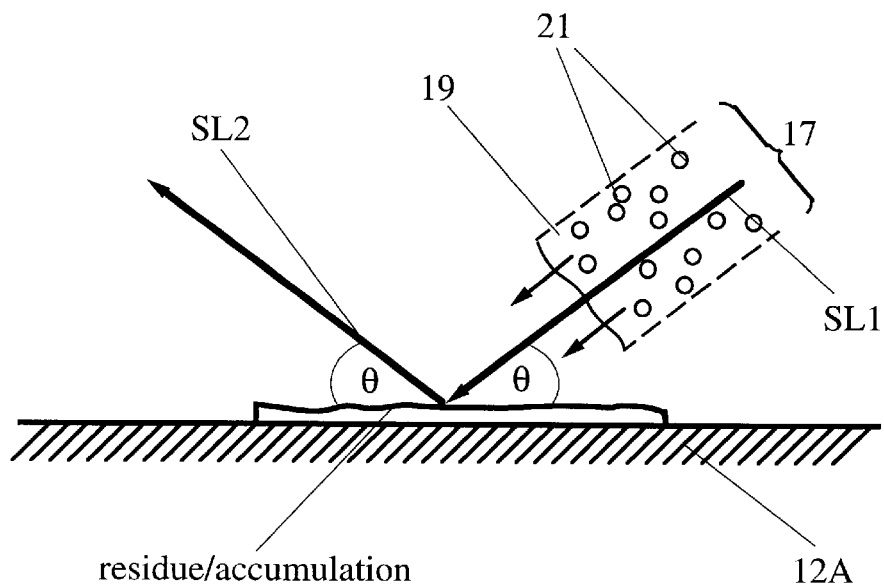
FIG. 5 illustrates schematically the scrubbing action of the slurry on an exposed surface.

Using kinetic theory arguments and similar considerations, the momentum transfer per unit time and per unit area from the slurry 17 to an exposed surface 12A of a object 11A may be roughly estimated as $$\Delta p = \{\rho_L(1-\eta_p)(v_c^2+\sigma^2)/3 + 2(\eta_p^{exp})(m_p v_c^2/V_p)\}\sin\theta, \quad (1)$$

$$\sigma^2 = k_B T/m, \quad (2)$$

$$exp \approx 1-1.33, \quad (3)$$

where $\rho$ and m are the mass density and molecular mass of the slurry liquid without the microscopic scrubber particles present, $\eta_p$, is the volume fraction of microscopic particles present in the slurry, $v_c$ is the jet or stream velocity of the slurry, T is the slurry temperature, $m_p$ and $V_p$ are the mass and volume of a representative microscopic scrubber particle, and $\Theta$ is the grazing angle of the jet or stream of the slurry, as illustrated in FIG. 5. Equation (1) provides an estimate of the scrubbing force exerted on the exposed surface 12A of the object 11A that is used to scrub or otherwise remove residues from the exposed surface.

The forces holding the residues and particles to the exposed surface 12A may be van der Waals forces, covalent forces, ionic forces or other suitable molecular effective adherence forces, and these adherence forces are expected to vary with the grazing angle $\Theta$, probably decreasing with decreasing grazing angle. Thus, the amount of residues removed from the exposed surface 12A may vary in a complex way with the grazing angle $\Theta$ and need not be monotonically increasing with increasing $\Theta$. Residue removal will likely vary with the residues to be removed, with the material that makes up the exposed particles, as well as with grazing angle $\Theta$.

Figure 6:
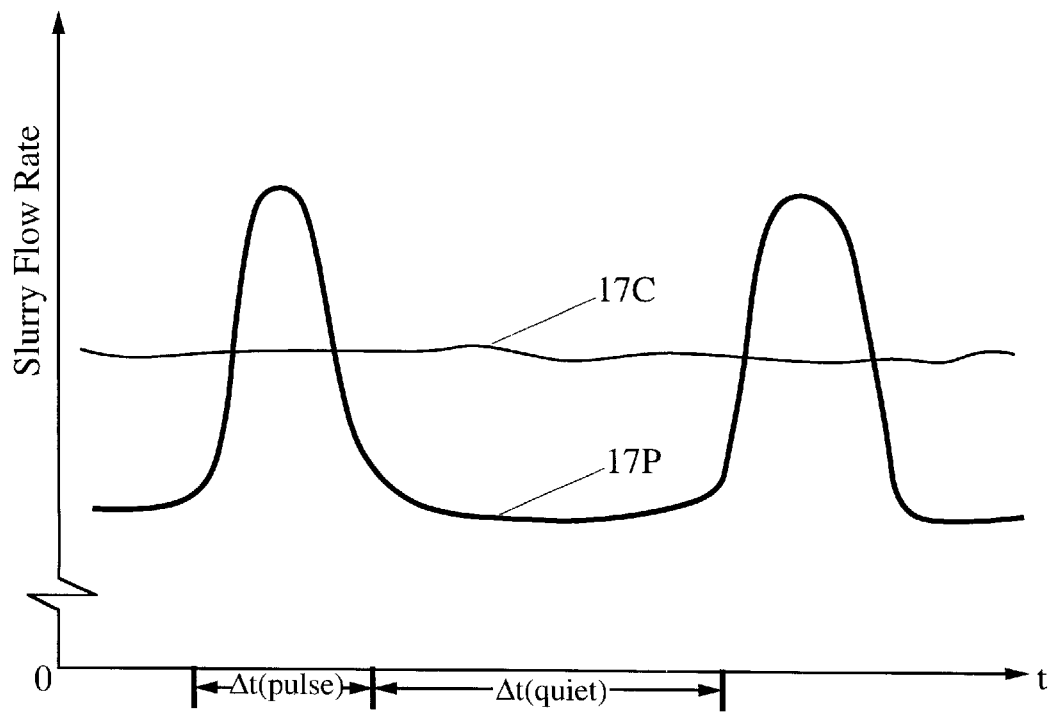
FIG. 6 is a graphical view illustrating pulsed slurry flow.

The delivery of the slurry 17 may be pulsed, as illustrated by the curve 17p in the graphical view in FIG. 6, rather than continuous and relatively constant, as illustrated by the curve 17c in FIG. 6, with a pulse interval length $\Delta t$(pulse) in the range 0.25–10 sec, and with a "quiet" interval length $\Delta t$(quiet) in the range 5–30 sec., during which the slurry flow is relatively small or zero. Use of a pulsed slurry flow may reduce the tendency of the slurry, which is reflected from and leaves the exposed surface 12A in the general direction SL2 to interfere with the scrubbing action of the slurry that is approaching the exposed surface in the general direction in FIG. 5.

Figure 7:
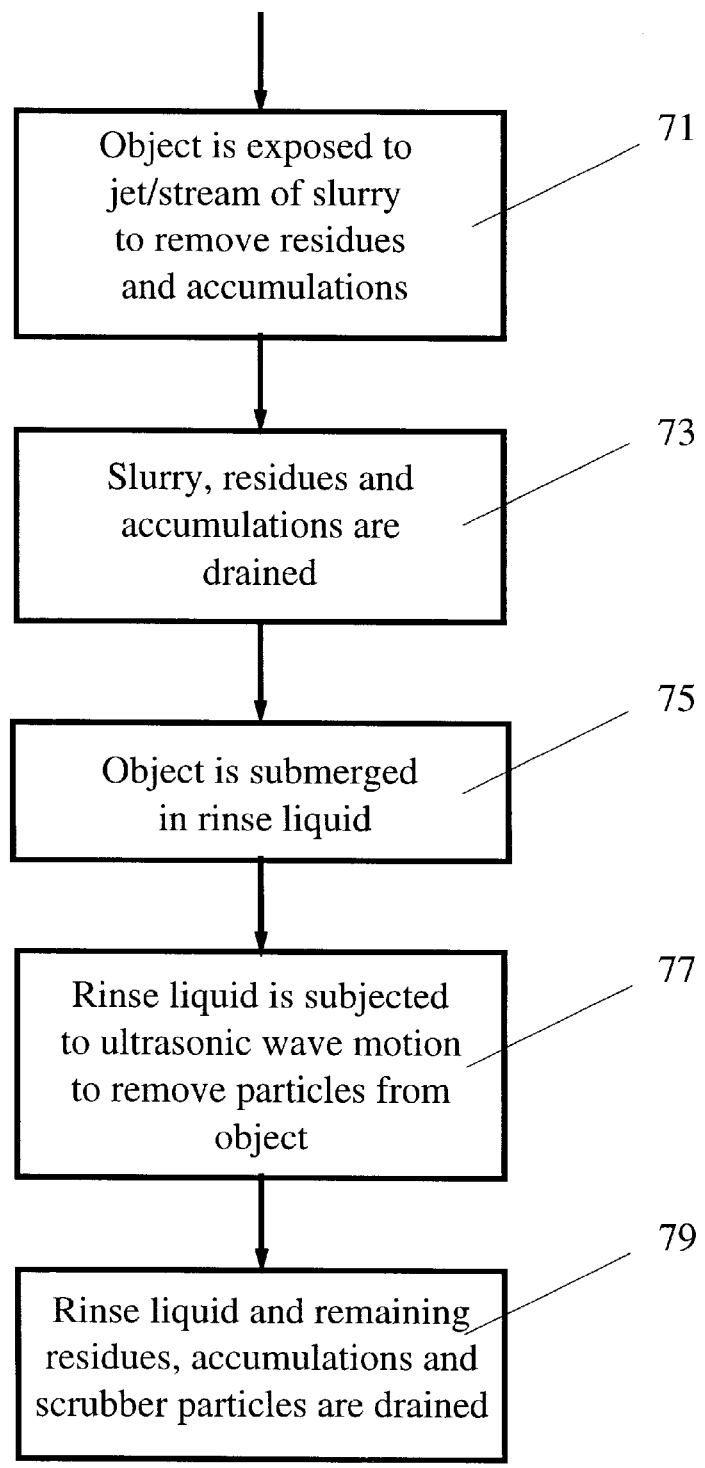
FIG. 7 is a flow chart illustrating the procedure of the invention in one embodiment.

FIG. 7 is a flow chart illustrating practice of the invention in one embodiment. In step 71, an object having an exposed surface to be cleaned is exposed to a jet or stream of slurry to remove chemical residues and particle accumulations on the exposed surface(s). Most or all of the residues and accumulations will be removed from the exposed surface in this step, but some chemical residues, particle accumulations and scrubber particles may remain on the exposed surface. The slurry is allowed to drain away in step 73. In step 75, the object is positioned in a liquid container and is partly or fully submerged in a rinse liquid so that the exposed surface is exposed to the rinse liquid. In step 77, the rinse liquid is subjected to ultrasonic wave action that removes most or all of the remaining chemical residues, particle accumulations and scrubber particles from the exposed surface. In step 79, the rinse liquid and remaining chemical residues, particle accumulations and scrubber particles are drained from the container. After the object has dried, the exposed surface of the object is substantially free of rinse liquid and remaining chemical residues, particle accumulations and scrubber particles.

I claim:

1. A method for removing chemical residues and accumulations of particles from an exposed surface of a solid object, the method comprising the steps of:

directing a slurry, which includes slurry liquid and includes scrubber particles having particle sizes lying in a selected range of sizes, against at least one exposed surface of an object having chemical residues or particle accumulations on the at least one exposed surface, to remove most or all of the residues and accumulations from the at least one exposed surface;

partly or fully submerging the at least one exposed surface in a rinse liquid that includes a strong base or a strong oxidizer; and subjecting the rinse liquid to ultrasonic waves with at least one selected wave displacement direction for a selected first time interval, where the ultrasonic waves have at least a selected first wavelength that is no greater than smallest expected size of a scrubber particle or other residue to be removed, to remove chemical residues, particle accumulations and scrubber particles that are on or adjacent to the at least one exposed surface.

2. The method of claim 1, further comprising the step of providing said ultrasonic waves with a second selected wavelength that is larger than said first wavelength.

3. The method of claim 2, further comprising the step of selecting said second wavelength to be no smaller than a largest expected size of said scrubber particle to be removed from said object.

4. The method of claim 1, further comprising the step of subjecting said rinse liquid to ultrasonic waves, having a second wavelength that is larger than said first wavelength, with a second selected wave displacement direction for a second selected time interval, where the second time interval and said first time interval overlap each other.

5. The method of claim 1, further comprising the step of subjecting said rinse liquid to ultrasonic waves, having a second wavelength that is larger than said first wavelength, with a second selected wave displacement direction for a second selected time interval, where the second time interval and said first time interval do not overlap each other.

6. The method of claim 1, further comprising the step of providing said scrubber particles in at least first and second distinct particle sizes, where the first scrubber particle size is selected to be no larger than a smallest expected size of said particle accumulations to be removed from said solid object and said second particle size is larger than said first particle size.

7. The method of claim 1, further comprising the step of providing said scrubber particles in at least first and second distinct particle sizes, where the second scrubber particle size is selected to be no smaller than a largest expected size of said particle accumulations to be removed from said solid object and the first particle size is smaller than the second particle size.

8. The method of claim 1, further comprising the step of drawing said rinse liquid from a group of chemically reactive liquids consisting of NaOH, KOH, $C_nH_{2n+1}OH(n=1, 2, \ldots)$, $H_2O_2$, $SOCl_2$, $NH_4OH$, $O_3 \cdot mH_2O$ ($m=0, 1, 2, \ldots$), $H_2SO_4$ or $HNO_2$.

9. The method of claim 1, further comprising the step of causing said ultrasonic waves to have an associated wave displacement direction that is approximately parallel to said at least one exposed surface of said object.

10. The method of claim 1, further comprising the step of choosing said selected range of slurry particle sizes to include at least a portion of the range 0.3 $\mu$m–100 $\mu$m.

11. The method of claim 1, further comprising the step of monotonically increasing said selected first wavelength over a selected range of wavelengths for said ultrasonic waves with time over said selected time interval.

12. The method of claim 11, further comprising the step of selecting range of wavelengths to cover at least a portion of expected sizes of said scrubber particles.

13. The method of claim 1, further comprising the step of monotonically decreasing said selected first wavelength over a selected range of wavelengths for said ultrasonic waves with time over said selected time interval.

14. The method of claim 13, further comprising the step of selecting range of wavelengths to cover at least a portion of expected sizes of said scrubber particles.

15. The method of claim 1, further comprising the step of providing said scrubber particles in a volume fraction in a range between 0.01 and 0.5 in said slurry.

16. The method of claim 1, further comprising the step of directing said slurry against said at least one exposed surface in a plurality of pulses, where each pulse has a pulse interval length of at least 0.25 sec.

17. A method for removing chemical residues and accumulations of particles from an exposed surface of a solid object, the method comprising the steps of:

directing a slurry, which includes slurry liquid and includes scrubber particles having particle sizes lying in a selected range of sizes, against at least one exposed surface of an object having chemical residues or particle accumulations on the at least one exposed surface, to remove most or all of the residues and accumulations from the at least one exposed surface;

partly or fully submerging the at least one exposed surface in a rinse liquid that includes a strong base or a strong oxidizer; and subjecting the rinse liquid to ultrasonic waves with at least one selected wave displacement direction for a selected first time interval, where the ultrasonic waves have at least a selected first wavelength that is no smaller than smallest expected size of a scrubber particle or other residue to be removed, to remove chemical residues, particle accumulation and scrubber particles that are on or adjacent to the at least one exposed surface.

18. The method of claim 17, further comprising the step of providing said ultrasonic waves with a second selected wavelength that is larger than said first wavelength.

19. The methods of claim 18, further comprising the step of selecting said second wavelength to be no smaller than a largest expected size of said scrubber particle to be removed from said object.

20. The method of claim 17, further comprising the step of subjecting said rinse liquid to ultrasonic waves, having a second wavelength that is larger than said first wavelength, with a second selected wave displacement direction for a second selected time interval, where the second time interval and said first time interval overlap each other.

21. The method of claim 17, further comprising the step of subjecting said rinse liquid to ultrasonic waves, having a second wavelength that is larger than said first wavelength, with a second selected wave displacement direction for a second selected time interval, where the second time interval and said first time interval do not overlap each other.

22. The method of claim 17, further comprising the step of drawing said rinse liquid from a group of chemically reactive liquids consisting of NaOH, KOH, $C_nH_{2n+1}OH(n=1, 2, \ldots)$, $H_2O_2$, $SOCl_2$, $NH_4OH$, $O_3 \cdot mH_2O$ ($m=0, 1, 2, \ldots$), $H_2SO_4$ or $HNO_2$.

23. The method of claim 17, further comprising the step of causing said ultrasonic waves to have an associated wave displacement direction that is approximately parallel to said at least one exposed surface of said object.

24. The method of claim 17, further comprising the step of monotonically increasing said selected wavelength over a selected range of wavelengths for said ultrasonic waves with time over said selected time interval.

25. The method of claim 24, further comprising the step of selecting range of wavelengths to cover at least a portion of expected sizes of said scrubber particles.

26. The method of claim 17, further comprising the step of monotonically decreasing said selected first wavelength over a selected range of wavelengths for said ultrasonic waves with time over said selected time interval.

27. The method of claim 26, further comprising the step of selecting range of wavelengths to cover at least a portion of expected sizes of said scrubber particles.

* * * * *